United States Patent [19]

Chambers, Jr.

[11] 4,350,964
[45] Sep. 21, 1982

[54] IMPEDANCE GENERATOR CIRCUIT

[75] Inventor: Charles W. Chambers, Jr., Downers Grove, Ill.

[73] Assignee: Tellabs, Inc., Lisle, Ill.

[21] Appl. No.: 164,308

[22] Filed: Jun. 30, 1980

Related U.S. Application Data

[62] Division of Ser. No. 45,274, Jun. 4, 1979, Pat. No. 4,283,604.

[51] Int. Cl.$^3$ .................................................. H03H 11/46
[52] U.S. Cl. .................................... 333/213; 307/324; 307/494; 333/216
[58] Field of Search ....................... 333/213, 214, 216; 307/297, 491, 493, 494, 502; 323/312, 316

[56] References Cited

U.S. PATENT DOCUMENTS 3,413,576 11/1968 Sheahan .......................... 307/297 X
3,828,281 8/1974 Chambers, Jr. .................. 333/214 X
4,288,707 9/1981 Katakura ......................... 307/493 X Primary Examiner—Paul L. Gensler
Attorney, Agent, or Firm—Gary, Juettner & Pyle

[57] ABSTRACT

An improved impedance generator circuit, for use with two-wire transmission systems of the type encountered in telephony, is adapted to be interfaced with the wires and operates in a manner to effectively generate a desired positive or negative impedance across the wires. The impedance generator includes a current source, and generates a positive impedance by drawing from the wires all of the current that would otherwise be required by the positive impedance, or a negative impedance by providing on the wires all of the current that would otherwise be provided by the negative impedance, in response to a metallic voltage applied across the wires by a signal source. At the same time, the impedance generator provides common mode rejection to longitudinal voltages on the wires.

16 Claims, 5 Drawing Figures

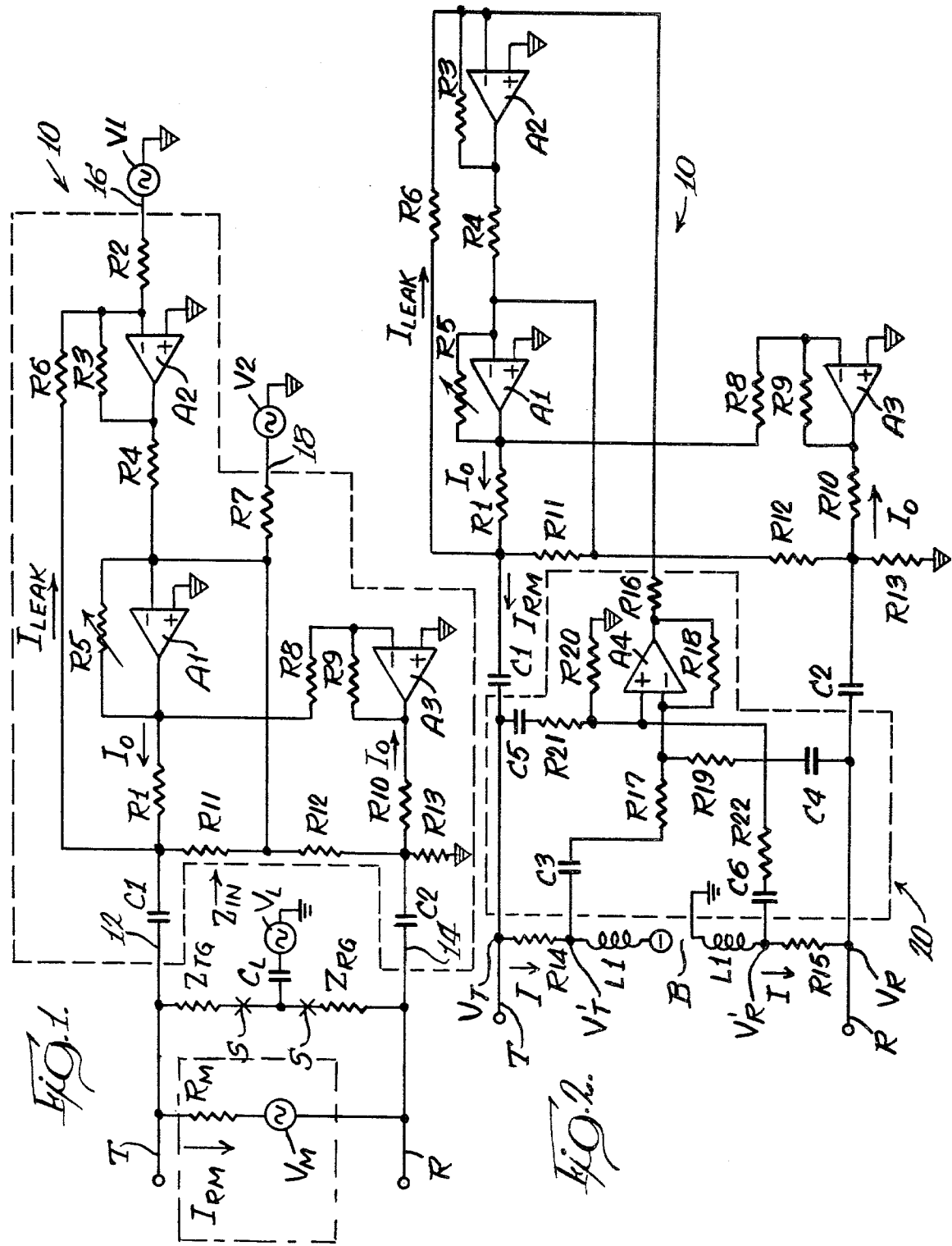

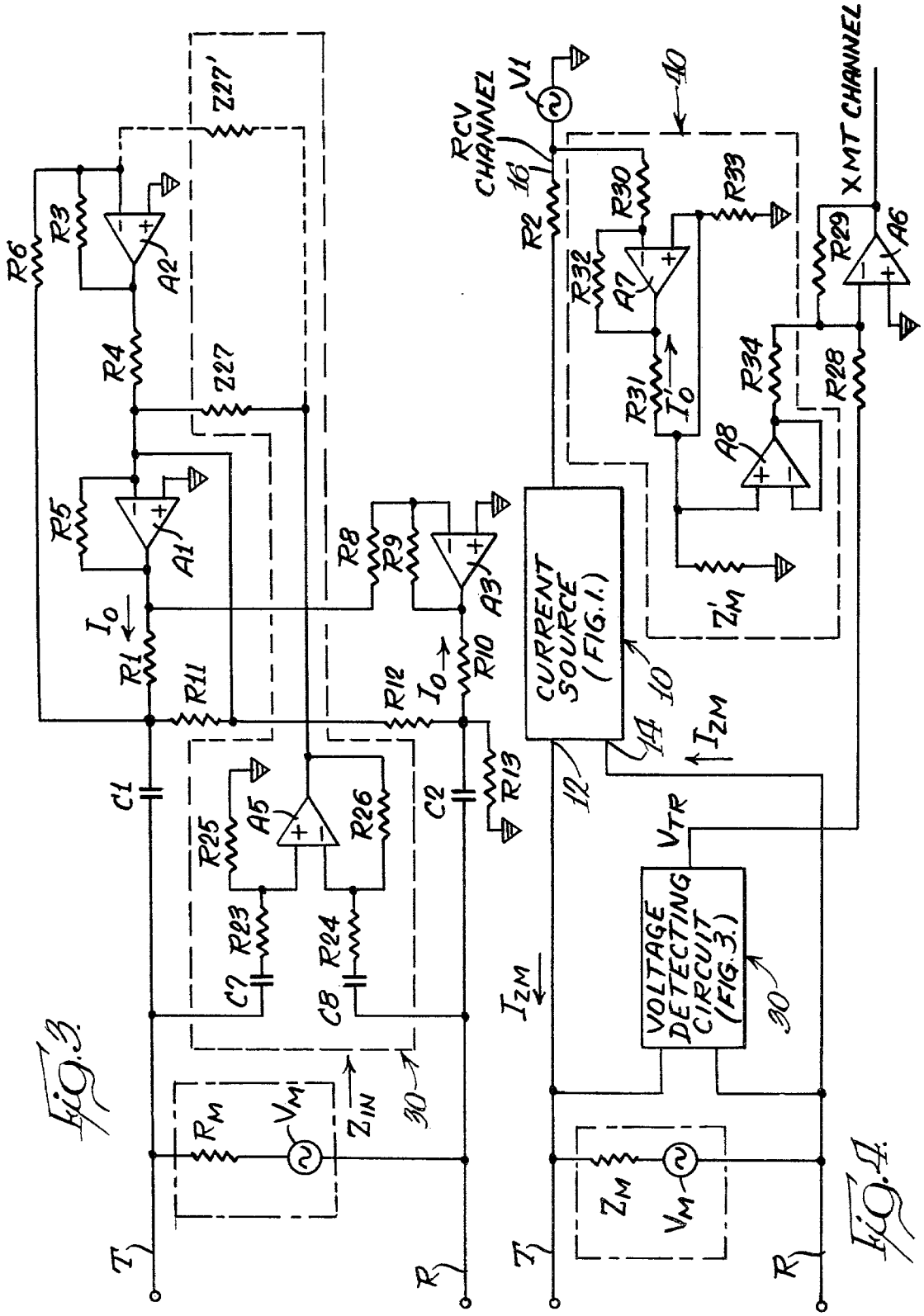

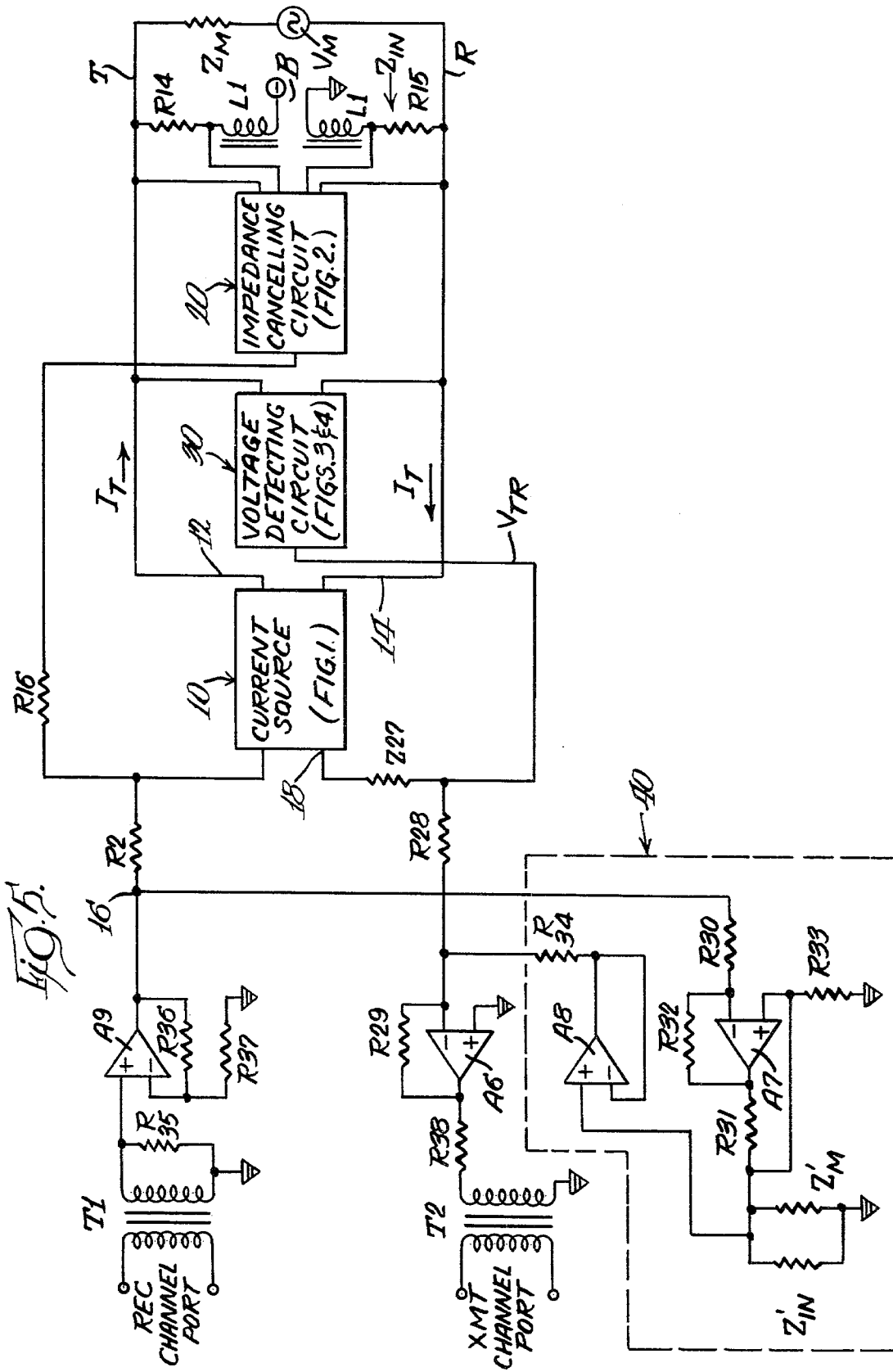

IMPEDANCE GENERATOR CIRCUIT

This application is a divisional application of prior application Ser. No. 45,274, filed June 4, 1979, now U.S. Pat. No. 4,283,604.

BACKGROUND OF THE INVENTION

The present invention relates to impedance generators in general, and in particular to an improved impedance generator for use with two-wire transmission systems and which has excellent common mode rejection to noise.

Metallic noise across two-wire telephone transmission pairs is undesirable since it affects both the quality of transmission and proper operation of equipment connected with the line. As is well known, to decrease the effect of metallic noise it is desirable to have both longitudinal balance and low impedance to ground in the tip and ring circuits of a telephone pair.

Nulling out equal voltages on the line of a telephone pair is called common mode noise rejection. It is well known, for example, that a well balanced, twisted telephone pair operating metallically provides rejection to noise inductively coupled from power lines. This is accomplished not only by the twisting imparted to the pair, but also by their having balanced longitudinal impedances to ground and equal series impedances.

Although much can be done to the tip and ring leads to enhance common mode rejection to noise, with prior art techniques some longitudinal noise nevertheless remains. In addition, equipment interfacing with the telephone pair can cause longitudinal unbalance and thereby increase noise on the pair. It is therefore very desirable to provide means for interfacing with a telephone pair without degrading the longitudinal balance thereon, while actually enhancing common mode rejection to noise by means of a low impedance balanced path to ground.

Since undesirable impedances often exist in a telephone pair, and since it is usually necessary to have a selected impedance across the pair, it would also be advantageous if the means for interfacing cancelled unwanted impedances from the pair while exhibiting a desired impedance across the pair.

Hybrid circuits are used in long distance telephone transmission facilities to interface between two and four-wire circuits. The four-wire circuit comprises one pair of wires called a receive channel and another pair called a transmit channel, and the conventional two-coil hybrid circuit couples signals from a distant subscriber on the receive channel with the two-wire circuit leading to a local subscriber, and couples signals from the local subscriber on the two-wire circuit with the transmit channel leading to the distant subscriber. It would therefore also be advantageous to provide an improved and accurate electronic hybrid circuit which provides common mode rejection to metallic noise on telephone pairs.

It is well known that current sources provide exceptional accuracy and would be very desirable circuit mediums or interface units for telephone applications, except that conventional current sources exhibit no common mode rejection to noise, but instead introduce longitudinal unbalance onto a telephone pair. Such undesirable characteristics of conventional current sources severely restrict their use in telephony, despite the fact that current sources otherwise exhibit other properties which would enhance their use.

OBJECTS OF THE INVENTION

An object of the present invention is to provide an improved impedance generator for interfacing with a two-wire transmission circuit while providing common mode rejection to noise on the circuit.

Another object of the present invention is to provide such a current source which exhibits a selected input impedance to the two-wire transmission circuit.

SUMMARY OF THE INVENTION

In accordance with the present invention, an impedance generator for a two-wire transmission system, of the type having a metallic voltage across the wires, comprises a current source having an input and first and second outputs, each output being connectable with a separate one of the wires. The current source generates at its outputs and through the wires a current flow having a value in accordance with the value of a signal at its input, and a monitoring means is connected at inputs thereto with the current source outputs for generating at an output therefrom a control signal having a value representative of the metallic voltage at the current source outputs and therefore across the wires. Means are provided for coupling the monitoring means output with the current source input for applying the control signal thereto, so that the current source is operated to generate at its outputs a current flow representative of that which would occur through a selected impedance connected across the current source outputs, and therefore across the wires, in response to the metallic voltage, whereby the impedance generator exhibits the selected impedance across the current source outputs and therefore across the wires.

The foregoing and other objects, advantages and features of the invention will become apparent upon a consideration of the following detailed description, when taken in conjunction with the accompanying drawings.

BRIEF DESCRIPTION OF THE DRAWINGS

FIG. 1 is a schematic circuit representation of a preferred embodiment of current source in accordance with the teachings of the present invention, showing the same connected with a network representation of the tip and ring leads to a two-wire telephone circuit;

FIG. 2 is a schematic circuit representation of an embodiment of the current source wherein the same effectively cancels an impedance on the tip and ring leads of the telephone circuit.

FIG. 3 is a schematic circuit representation of an embodiment of the current source wherein it provides a selected input impedance to the tip and ring leads of the telephone circuit;

FIG. 4 illustrates partly in schematic and partly in block diagram form an arrangement of the current source which forms an electronic hybrid circuit for interfacing between a two and four-wire telephone transmission facility, and FIG. 5 illustrates partly in schematic and partly in block diagram form a terminating set formed with the current source of the invention, for interfacing between a two and a four-wire telephone transmission facility.

DETAILED DESCRIPTION

Referring to FIG. 1, there is shown within dashed lines and indicated generally at 10 a novel current source circuit in accordance with a preferred embodiment of the invention. For the purpose of illustrating operation and use of the current source, the same is shown connected or interfacing at outputs 12 and 14 therefrom with a pair of telephone wires comprising a tip lead T and a ring lead R. To schematically represent metallic signal and impedance conditions that normally exist across such tip and ring leads, a metallic voltage source $V_m$ and a load $R_m$ are shown connected in series between the leads, and to represent longitudinal noise which is inherent on the leads a longitudinal voltage generator $V_L$ in series with a longitudinal capacitance $C_L$ is connected between ground and the tip lead through a tip lead to ground impedance $Z_{tg}$ and between ground and the ring lead through a ring lead to ground impedance $Z_{rg}$. To facilitate a description of the current source, switch contacts S are illustrated for connecting and disconnecting the longitudinal voltage and impedances with and from the tip and ring leads, although it is understood that in practice such longitudinal voltage and impedances cannot be disconnected. For the purpose of decreasing longitudinal noise the tip and ring leads are usually twisted about each other to form a twisted telephone pair, and it is assumed that the impedances $Z_{tg}$ and $Z_{rg}$ are equal so that the leads have balanced longitudinal impedances to ground.

The current source of the invention interfaces with the tip and ring leads, connects signals therewith and operates in a manner that provides common mode rejection to noise on the leads. That is, the current source nulls out equal common mode noise or longitudinal voltages on the tip and ring leads, but does not affect the differential or metallic voltage thereacross. To this end, the current source includes an operational amplifier (op amp) A1 connected at its output with the tip lead T through a resistor R1 in series with a capacitor C1, and an op amp A2 for receiving at its inverting input a voltage from a signal sourve V1 through a resistor R2. The signal source V1 may represent, for example, speech signals from a subscriber's handset, which are to be applied across the tip and ring leads. A noninverting input to the op amp A2 is connected to reference or ground potential and the output from the op amp is applied both to its inverting input through a resistor R3 and to an inverting input to the op amp A1 through a resistor R4. A noninverting input to the op amp A1 is coupled to reference potential and a potentiometer R5 is between the output from and the inverting input to the op amp. A resistor R6 provides feedback from the juncture between the capacitor C1 and the resistor R1 to the inverting input to the op amp A2, and the inverting input to the op amp A1 receives through a resistor R7 a voltage signal from a signal source V2. Similar to the signal source V1, the signal source V2 represents a signal to be applied across the tip and ring leads, except as compared with a signal from the source V1, and as will be described, the signal across the tip and ring leads from the source V2 will be inverted.

To the extent described the circuit comprising the resistors R1–R7 and the op amps A1 and A2 comprises a conventional current source of a type known in the art. Because of the double inverting function performed by the op amps A1 and A2 the signal source V1 generates a noninverted output current $I_0$ and the signal source V2 an inverted current at the output from the op amp A1. It is understood, of course, that this conventional current source is a single ended current source not suitable for direct coupling to telephone lines, but for the purpose of facilitating an understanding of the current source of the invention, as will hereinafter be described, the operation of the conventional current source will first be considered.

In use of the circuit thus far described, and in the overall invention, the normal scaling of the various resistors is such that the resistors R3, R4, R5 and R6 have equal values, and the resistor R6 provides 100% positive feedback for any output voltage $V_{A1}$ from the op amp A1 minus the voltage drop across the resistor R1. Therefore, the op amp A1 will generate at its output a voltage which causes a prescribed output current $I_0$ to flow through the resistor R1 in order to reduce the positive feedback through the resistor R6. For example, if the voltage V1 at a noninverting input 16 to the current source equals 1.0 volt, the voltage V2 at an inverting input 18 to the current source equals 0 volts, and the values of the resistors R2 and R3 are equal, then the voltage $V_{A1}$ will rise sufficiently high to generate an output current flow which causes a 1.0 volt drop across the resistor R1. Thus, if the resistor R1 equals 1000 ohms, then 1.0 milliamp of output current $I_0$ will be produced for each volt generated by the signal source V1. Mathematically, the current at the output from the op amp A1 may be expressed as follows:

$$I_0 = V1R5/R2R1 - V2R5/R7R1.$$

Because of the resistor R6, it is apparent that only a part of the output current $I_0$ is delivered to a load, for example the load $R_m$, since the output current is split between the load and the resistor R6.

To provide a double ended current source for interfacing with the tip and ring leads T and R, in accordance with the teachings of the present invention the circuit also includes an op amp A3 connected at an inverting input thereto with the output from the op amp A1 through a resistor R8 and having a resistor R9 connected between its output and inverting input. A noninverting input to the op amp A3 is connected to reference potential, and its output is coupled with the ring lead R through a resistor R10 in series with a coupling capacitor C2 and with reference potential through a resistor R13. If in the double ended circuit the resistor R8 equals the resistor R9, the resistor R1 equals the resistor R10 and the coupling capacitors C1 and C2 are neglected, then the current $I_{rm}$ delivered to the load resistance $R_m$ is $$R_{rm} = I_0 R6 R_m / R_m (R6 + R_m)$$

Also, an input impedance $Z_{in}$ to the current source would then be essentially equal to the value of the resistor R6, and the output voltages from the op amps A1 and A3 would not permit any current generated by the metallic source $V_m$ to flow through either of the resistors R1 and R10.

In order to provide the current source with common mode rejection to longitudinal noise in the tip and ring leads, the invention also centemplates connection of a pair of equal value resistors R11 and R12 in series between the juncture of the resistor R1 and the coupling capacitor C1 and the juncture of the resistor R10 and the coupling capacitor C2, with a juncture between the resistors R11 and R12 being coupled with the inverting input to the op amp A1. In this manner, a voltage signal generated by the signal source V1 will still generate an output current $I_0$ as shown, and a voltage signal generated by the signal source V2 and inverted output current, but the current source will nevertheless have common mode rejection to noise.

To this point it has been assumed that the switch S was open so that there were no longitudinal voltages or impedances on the tip and ring leads. Obviously, such noises and impedances exist on actual telephone circuits, and for the purpose of describing the common mode rejection to noise of the current source it is now assumed that the switch S is closed so that each of the tip and ring leads has a longitudinal voltage as well as a longitudinal impedance to ground. In practice the inherent longitudinal impedances $Z_{tg}$ and $Z_{rg}$ are substantially equal, and noise suppression results when the longitudinal voltages induced on the tip and the ring leads are both as low as possible and as equal as possible. Noise or common mode voltage is an unwanted tip to ring potential, and the first requirement for noise suppression is balanced tip lead to ground and ring lead to ground impedances.

For balanced tip lead to ground and ring lead to ground impedances, the values of the capacitors and resistors are selected so that:

$C1 = C2$, $R1 = R10$, $R6 = R13$, $R8 = R9$, and $R11 = R12 = 2R6 = 2R13$, which not only provides the necessary longitudinal impedance balance, but also disables the outputs of the op amps A1 and A3 so that the same are 0 volts or ground in response to equal longitudinal voltages on the tip and ring leads. When the outputs from the op amps A1 and A3 are 0 volts to longitudinal voltages, then both the tip and ring lead longitudinal voltages are decreased since the current source provides a relatively low, balanced impedance path from the tip lead to ground and from the ring lead to ground.

When equal common mode voltages are applied to the tip and ring leads, the foregoing scaling of the resistors and capacitors results in a current flow through the resistors R11, R12 and R4 the sum of which equals, zero, or:

$I_{R11} + I_{R12} + I_{R4} = 0$

Consequently, with the established relationship the sum of the current flow at the inverting input to the op amp A1 is zero and the output voltages from the op amps $V_{A1}$ and $V_{A3}$ are each equal to zero to longitudinal voltages, whereby common mode rejection to noise is obtained from the current source 10.

The foregoing result is perhaps best explained by way of example. Assume, for instance, that the longitudinal voltages of the tip and ring leads are such that one volt is applied to the node defined by the capacitor C1 and the resistors R1, R6 and R11, and one volt is also applied to the node defined by the capacitor C2 and the resistors R10, R12 and R13. Under this condition, the following current flows occur:

$I_{R11} = 1/R11$, $I_{R12} = 1/R12$, and $I_{R4} = -R3/R6R4$.

Since from the previously defined resistor values $R3/R6 = 1$, and $R11 = R12 = 2R4$, the current at the inverting input to the op amp A1 sums to zero and therefore the voltages at the outputs from the op amps A1 and A3 equal zero. Thus, common mode rejection to longitudinal noise is offered by the current source 10.

Since the outputs from the op amps A1 and A3 are zero to longitudinal voltages on the tip and ring leads, but not to metallic voltages, the current source decreases the tip and ring lead longitudinal voltages and generates a low value, balanced impedance path from the tip lead to ground and from the ring lead to ground. To this end, the longitudinal impedance from the tip lead to ground is $$Z_{tg} = \frac{R1R6R11/(R6 + R11)}{R1 + R6R11/(R6 + R11)} + X_{C1}$$

and from the ring lead to ground is $$Z_{rg} = \frac{R10R12R13/(R13 + R12)}{R10 + R13R12/(R13 + R12)} + X_{C2}.$$

Obviously, the total impedance presented to the longitudinal voltage by the current source is equal to the parallel combination of the tip to ground and the ring to ground longitudinal impedances, or $Z_1 = Z_{tg}Z_{rg}/(Z_{tg} + Z_{rg})$ Consequently, for equal common mode voltages on the tip and ring leads T and R the sum of the currents at the inverting input to the op amp A1 is zero and the output voltages from the op amps A1 and A3 are zero, whereby the current source provides common mode rejection to the longitudinal voltages on the tip and ring leads.

Another important attribute of the current source of the invention is its accuracy in providing a signal from the source V1 and/or V2 onto the tip and ring leads. If the values of the resistors are set so that the resistors R3, R4, R6 and R13 all have equal values, and so that the value of the resistor R8 equals that of the resistor R9, then the error or leakage current $I_{leak}$ flowing through the resistor R6 equals $I_{leak} = 1/R1 + 1/R6 - R5/R1R6$.

Accordingly, the leakage or error current $I_{leak}$, or that portion of the output current $I_0$ flowing through the resistor R6, can at least in theory be eliminated by a proper selection of the value of the resistor R5.

The leakage current $I_{leak}$ through the resistor R6 can become quite significant if the impedances of the coupling capacitors C1 and C2 are considered at low frequencies. A normal method of reducing the leakage current would be to make the values of the resistors R6 and R3 very large. However, this strategy backfires because the offset voltage of op amps is much greater when large value resistors are used, and in practice the value of the resistor R5 cannot be set so that the leakage current is equal to zero. Nevertheless, through the proper selection of op amp resistors, etc., the value of the leakage current can be made to very closely approach zero, and in the disclosure which follows it is assumed that the resistor R5 has been adjusted to reduce the leakage current $I_{leak}$ to a sufficiently low value so that it can, for all practical purposes, be ignored. To this end, the adjustment of the resistor R5 which, at least in theory, reduces the leakage current to zero, occurs when the value of the resistor R5 equals the sum of the values of the resistors R1 and R6.

It is worth noting that the input impedance $Z_{in}$ of the current source to the metallic voltage can theoretically be made infinite, so that the current source does not in any way load down the metallic signal on the tip and ring leads. In particular, the metallic input impedance $Z_{in}$ of the current source is equal to $$Z_{in} = 1/(1/R1 + 1/R6 - R5/R1R6).$$

Accordingly, the basic current source of the invention provides an efficient and improved means for interfacing with the tip and ring leads of a two-wire telephone circuit while providing common mode rejection to longitudinal noise on the circuit, for generating a selected and if desired substantially infinite input impedance to the metallic voltage on the circuit, while simultaneously permitting connection of external signals with the circuit as represented by the voltages from the signal sources V1 and V2. In this connection, the output current $I_0$ provided by the current source in response to voltage signals from the signal sources V1 and V2 is $$I_0 = V1R5/R1R2 - V2R5/R1R7,$$

and the current $I_{rm}$ through the metallic load $R_m$ in response to the output current $I_0$ is $$I_{rm} = V1R6/R1R2 - V2R6/R1R7,$$

when the component values of the current source have been adjusted so that the leakage current through the resistor R6 is insignificant.

The current source of FIG. 1 thus provides common mode rejection to noise on the tip and ring leads of a two-wire telephone transmission system while allowing a current signal to be introduced onto the lines which is a very accurate representation of voltage signals generated by the signal sources V1 and/or V2. At the same time, the current source presents a selected input impedance to the circuit. The current source, however, has significant additional versatilities in use with telephone circuits, and is capable of a number of modes of operation, all of which enhance its use in telephony.

For example, in the embodiment of the current source as shown in FIG. 2, the same may be interfaced with the tip and ring leads of the telephone circuit and operated in such a manner as to effectively eliminate or cancel an unwanted impedance across the tip and ring leads. One such type of impedance is a battery fed relay coil or, as shown in FIG. 2, an inductively isolated battery feed comprising a series connection of a pair of resistors R14 and R15 with an inductor L1 in line with a battery B across the tip and ring leads. Conceptually, the impedance presented by the inductor L1 and the resistors R14 and R15 can be effectively eliminated or cancelled if the current source supplies all of the current that would otherwise be required by the impedance should a metallic voltage be applied across the tip and ring leads, so that the metallic voltage or signal source does not supply such current and the impedance provided by the inductor L1 and resistors R14 and R15 appears as an open circuit to the metallic voltage. Of particular interest is the fact that the impedance can be eliminated or cancelled metallically, yet remain undisturbed longitudinally.

Referring in particular to FIG. 2 wherein like reference numerals denote like components, impedance cancellation is accomplished by replacing the resistor R2 and noninverting signal source V1 of FIG. 1 with an impedance cancelling circuit, indicated generally at 20, which includes a resistor R16 and an op amp A4. An inverting input to the op amp connects with the juncture between the resistor R14 and the inductor L1 through a resistor R17 and a capacitor C3, with the output from the op amp through a resistor R18, and with the ring lead R through a resistor R19 and a capacitor C4. A noninverting input to the op amp connects with ground or reference potential through a resistor R20, with the tip lead T through a resistor R21 and a capacitor C5, and with the juncture between the resistor R15 and the coil L1 through a resistor R22 and a capacitor C6.

To eliminate the metallic impedance of the inductor L1 and the resistors R14 and R15, the component values of the impedance cancelling circuit 20 are chosen so that equal voltages on the tip and ring leads do not produce a voltage $V_{A4}$ at the output from the op amp A4. To have 0 volts at the output from the op amp A4 in response to equal tip and ring lead voltages, and also to have longitudinal balance and common mode rejection to noise, the component values are selected so that the capacitors C3, C4, C5 and C6 are equal, the resistors R17, R19, R21 and R22 are equal, the resistors R14 and R15 are equal, and the resistors R18 equals the resistor R20. In addition, the values of the resistors R14, R15, R17 and R21 are quite large, so that in operation of the circuit the loading effect of those resistors, and therefore of the capacitors C3–C6, is negligible. In addition, the value of the resistors R17, R19, R21 and R22 is chosen to be much greater than the capacitive reactance of the capacitors C3–C6 at the frequency of operation of the circuit.

The output voltage $V_{A4}$ from the op amp A4 is proportional to a current I flowing through the unwanted impedance comprising the inductor L1 and the resistors R14 and R15. To demonstrate this relationship, the voltage on the tip lead is defined as $V_t$, that at the juncture of the resistor R14 and the inductor L1 as $V_t'$, that on the ring lead as $V_r$ and that at the juncture between the resistor R15 and the inductor L1 as $V_r'$. With these designations, the voltage $V_{A4}$ at the output from the op amp A4 may be expressed as:

$$A_{A4} = (V_t - V_t' + V_r' - V_r)R18/R17,$$

and the current I flowing through the impedance comprising the inductor L1 and the resistors R14 and R15 is:

$$I = (V_t - V_t')/R14 = (V_r' - V_r)/R15.$$

Since the op amp A4 has replaced the signal source V1 of FIG. 1 then, from the equations developed with respect to FIG. 1, for the circuit of FIG. 2 the output current $I_0$ flowing through the resistor R1 of the current source 10 is:

$$I_0 = V_{A4}R5/R1R16,$$

and the current $I_{rm}$ delivered to the load, which is the output current $I_0$ less any leakage current $I_{leak}$ through the resistor R6, is:

$$I_{rm} = V_{A4}R6/R1R16$$

When the load current $I_{rm}$ delivered by the current source to the unwanted load impedance comprising the resistors R14 and R15 and the inductor L1 is made equal to the current I that would otherwise flow through the load in response to a metallic voltage across the tip and ring leads, the metallic voltage source does not generate any current flow through the impedance and the impedance appears as an open circuit to the metallic voltage, whereby the impedance is effectively cancelled with respect to the metallic voltage source. Cancellation occurs when the value of the resistors are adjusted so that:

$$I_{rm} = I, \text{ and}$$

$$R5 = R1 + R6.$$

It is worth noting that the value of the inductor does not enter into impedance cancellation. Accordingly, the inductor may have any value, its value may change with a d.c. current flow therethrough, age, etc., and yet the circuit nevertheless automatically eliminates the metallic impedance presented by the inductor L1 and the resistors R14 and R15. Obviously, the circuit may be used to eliminate any unwanted metallic tip to ring lead impedance without disturbing their longitudinal impedances.

FIG. 1 illustrates use of the basic current source 10 as an interface for introducing signal voltages, for example speech signals, onto the tip and ring leads of a two-wire telephone circuit, while at the same time providing common mode rejection to noise. In FIG. 2 the current source similarly has common mode noise rejection, and includes an impedance cancelling circuit 20 for effectively eliminating an unwanted metallic impedance from between the tip and ring leads. As described in respect of the embodiment in FIG. 1, which description also applies to the embodiment of FIG. 2, the input impedance $Z_{in}$ looking into the current source may, with the resistor R5 properly adjusted, be theoretically made infinite. The embodiment shown in FIG. 3, however, demonstrates use of the invention to electronically and accurately generate any selected input impedance $Z_{in}$, which conventionally is ordinarily accomplished with a transformer coupled voltage source across the tip and ring leads. Unfortunately, in such conventional practice the size, cost, leakage reactance, magnetizing current, etc., of a transformer creates considerably greater error than is desired. Such deficiences are not present in the circuit of FIG. 3.

Referring to FIG. 3, the circuit thereof includes the basic current source of FIG. 1 in which like reference numerals have been used to denote like components, and the operation of which is the same as described in respect of FIG. 1. The circuit of FIG. 3 further includes, however, a tip to ring voltage detecting circuit, indicated generally at 30, comprising a differential op amp A5 connected at its noninverting input with the tip lead through a resistor R23 and a capacitor C7 and at its inverting input with the ring lead through a resistor R24 and a capacitor C8. A resistor R25 is between the noninverting input to the op amp and ground, and a resistor R26 is between the inverting input to and the output from the op amp. The particular connections cause the op amp to operate as a differential amplifier and to exhibit common mode rejection to noise.

In selecting the parameters of the circuit, the values of the resistors R23 and R24 are chosen to be sufficiently high so as to present a negligible load, and the values of the resistors R23 and R24 and of the capacitors C7 and C8 are chosen so that the resistors present a considerably higher impedance than do the capacitors at the frequency of operation of the circuit. In addition, the capacitor C7 is equal in value to the capacitor C8, the resistors R25 and R26 are equal, and the values of the resistors R23 and R24 are equal and significantly greater than either the load impedance $R_m$ or a desired input impedance $Z_{in}$ to the circuit.

The output voltage $V_{A5}$ from the op amp A5 is dependent upon its gain. To this end, the gain $G_{A5}$ of the op amp A5 equals R26/R24 or R25/R23. Accordingly, the output voltage $V_{A5}$ is equal to the voltage $V_{tr}$ between the tip and ring leads times the gain of the op amp, or:

$$V_{A5} = V_{tr}G_{A5}$$

In order to generate a selected input impedance $Z_{in}$, the output from the op amp A5 is connected either with the inverting input to the op amp A1 through an impedance Z27 or with the inverting input to the op amp A2 through an impedance Z27'. In the case where the output from the op amp A5 is connected with the op amp A1, the op amp A5 and impedance Z27 essentially take the place of the signal source V2 and resistor R7 of FIG. 1, and cause an inverted output current $I_0$ to be generated by the op amp A1. The inverted output current represents a current that would be drawn by a positive impedance, whereby through proper selection of component values for the circuit a positive input impedance $Z_{in}$ to the circuit, or a positive impedance across the tip and ring leads, may be generated. In the case where the output from the op amp A5 is applied to the inverting input to the op amp A2, then the op amp A5 and impedance Z27' essentially take the place of the signal source V1 and resistor R2 of FIG. 1 and cause a noninverted output current $I_0$ to be generated by the op amp A1. The noninverted output current represents a current flow that would be provided by a negative impedance, whereby through proper selection of component values for the circuit a negative input impedance $Z_{in}$ to the circuit, or a negative impedance across the tip and ring leads, may be generated.

In accomplishing the foregoing, and considering the relationship of component values previously set forth, to generate a positive input impedance $Z_{in}$ the output from the op amp A5 is connected with the inverting input to the op amp A1 through the impedance Z27 and the value of the impedance Z27 is selected such that $$Z27 = R6G_{A5}Z_{in}/R1,$$

where $Z_{in}$ is the value of the desired positive impedance. Should a negative input impedance be desired, then the output from the op amp A5 is applied to the inverting input to the op amp A2 through the impedance Z27' and the value of the impedance Z27' is chosen such that $$Z27' = R6G_{A4}Z_{in}/R1,$$

where $Z_{in}$ represents the value of the desired negative impedance.

Consequently, simply by selecting appropriate values for the impedances Z27 or Z27', positive or negative impedance of any selected value may be generated at the input to the current source and across the tip and ring leads. It is understood, of course, that the various embodiments of the invention thus far described may be combined so that, if desired, as shown in FIG. 2 an undesired impedance can be eliminated from across the tip and ring leads while, as shown in FIG. 3, a selected terminating impedance can simultaneously be generated across the leads, all the while offering common mode rejection to longitudinal noise on the leads.

FIG. 4 illustrates another embodiment of the invention, wherein the current source is modified to operate as an electronic hybrid circuit. As is known in the art, conventional hybrid circuits of the two-coil variety are used to interface between four-wire long distance telephone transmission circuits and two-wire circuits leading to local subscribers. In its operation, the hybrid circuit transfers voice signals on a receive channel of the four-wire circuit to the two-wire circuit without, at least theoretically, coupling signals on the receive channel with a transmit channel of the four-wire circuit, and connects signals on the two-wire circuit with the transmit channel. Any cross coupling of signals from the receive to the transmit channel is undesirable, since such coupled signals comprise an echo signal which is returned, unless otherwise eliminated, to the distant subscriber. Although conventional two-coil hybric circuits are reasonably accurate for trans-hybrid loss, the transformers for the circuits are expensive, bulky and do not provide as satisfactory a tip to ring lead input impedance as does the present invention when used as an electronic hybrid circuit.

For the purpose of clarity, in FIG. 4 the basic current source 10 shown in FIG. 1 and the voltage detecting circuit 20 of FIG. 3 are illustrated in block diagram form. Actually, the current source and the voltage detecting circuit are arranged substantially as shown in FIG. 3, except that the output from the voltage detecting circuit is not applied as an input to the current source.

More particularly, as shown in FIG. 4 the tip and ring leads T and R of a two-wire transmission circuit leading to a local subscriber have a load impedance $Z_m$ and a voltage source $V_m$, representative of the impedance and voltage signals generated by the local subscriber's hand set, connected in series thereacross. The inputs to the voltage detecting circuit 30 and the outputs from the current source 10 are connected across the tip and ring leads, and the current source receives at its noninverting input 16 voltage signals from the signal source V1, which represent speech signals from a far end subscriber on the receive channel.

An op amp A6 has its output connected with the transmit channel leading to the far end subscriber, a noninverting input to the op amp is referenced to ground, its inverting input is coupled with the output from the voltage detecting circuit 30 through a resistor R28, and a resistor R29 is between the inverting input to and the output from the op amp. Intermediate the receive and transmit channels is an electronic hybrid circuit, indicated generally at 40, comprising an op amp A7 coupled at its inverting input with the signal on the receive channel through a resistor R30 and at its output with its noninverting input through a resistor R31. A resistor R32 is between the inverting input to and the output from the op amp A7, and the noninverting input to the op amp is coupled with reference potential through a resistor R33. An impedance $Z_m'$ is connected between ground and the output from the op amp A7 through the resistor R31, and an op amp A8 has its noninverting input coupled with the juncture between the impedance $Z_m'$ and the resistor R31. An inverting input to the op amp A8 is tied to its output, and the output from the op amp is applied to the inverting input to the op amp A6 through a resistor R34.

In operation of the circuit, signals on the receive channel at the noninverting input 16 to the current source cause a current flow $I_{zm}$ on the tip and ring leads, so that the local subscriber hears the far end subscriber's voice. Because of impedances on the tip and ring leads, which include the impedance $Z_m$, the current flow on the leads generates a voltage across the leads, which in turn causes an output voltage from the voltage detecting circuit 30. The output from the voltage detecting circuit is applied to the inverting input to the op amp A6, and without more would be returned over the transmit channel to the far end speaker as echo. An object of the hybrid circuit 40 is, therefore, to null any output from the op amp A6 which is in response to signals from the signal source V1. However, upon the occurrence of near end speech as represented by a voltage differential across the tip and ring leads from the signal source $V_m$, which also causes an output from the voltage detecting circuit, it is desirable that the op amp A6 generate an output which is proportional to the signal from the source $V_m$ in order that the near end subscriber's voice signals may be transmitted to the far end subscriber.

In accomplishing the foregoing, the op amp A7 and its associated resistors R30–R33 comprise an inverting current source for generating an output current $I_0'$ in response to signals from the source V1. The relationship between the resistors R30–R33 is such that the resistors R30 and R33 are equal in value, the resistors R31 and R32 are equal, and the resistors R30 and R33 are each significantly greater in value than the resistors R31 and R32. Under this condition, the output current $I_0'$ through the resistor R31 is $$I_0' = -V1/R30.$$

As discussed with respect to the basic current source of FIG. 1, the current $I_{zm}$ applied to the load $Z_m$ is $$I_{zm} = V1R6/R1R2,$$

and in order to obtain a null or zero volt output from the op amp A6 in response to signals from the source V1 it is necessary that $$I_{zm}Z_m + I_0'Z_m' = 0.$$

To this end, the op amp A8 is merely a buffer amplifier and the op amp A6 an inverting summing amplifier. Thus, if in response to signals from the source V1 the voltage applied across the resistor R34 by the op amp A8 equals the voltage generated across the resistor R28 by the voltage detecting circuit, then the output from the op amp A6 will be nulled to zero.

In order that the load current $I_{zm}$ might be equal to the current $-I_0'$, the values of the resistors are adjusted such that R6/R1R2 is equal to 1/R30. Then, if the voltage detecting circuit is set for a 1:1 conversion, the impedance $Z_m'$ equals the load impedance $Z_m$ and R34 equals R28 for nulling to zero the output from the op amp A6 in response to signals on the receive channel. Consequently, speech signals on the receive channel are not returned to the far end subscriber as echo.

Note, however, that the op amp A6 does not interfere with the transmission of speech signals from the near end to the far end subscriber. To this end, upon the occurrence of an output from the signal source $V_m$, representative of the near end subscriber speaking, the voltage across the tip and ring leads is converted by the voltage detecting circuit 30 and the op amp A6 to a voltage $V_{A6}$ at the output from the op amp. In this connection, the voltage $V_{A6}$ is equal to $V_{tr}R29/R28$, where $V_{tr}$ is the voltage generated across the tip and ring leads by the source $V_m$ and the voltage detecting circuit has a gain of 1. Obviously, the value of the resistor R29 may be set to provide a desired gain for the op amp A6 in response to near end speech signals.

Accordingly, the foregoing embodiment of the invention provides a unique electronic hybrid circuit for interfacing between two and four-wire long distance telephone transmission facilities. It is understood, of course, that the impedance $Z_m'$ may only be a best approximation of the expected load impedance $Z_m$, and that inaccuracies in the approximation will result in some portion of the signal on the receive channel being coupled with the transmit channel as echo. However, such coupling commonly occurs with two-coil hybrid circuits of the conventional type, and this characteristic of the electronic hybrid circuit is certainly no worse than that expected in conventional circuits. Advantageously, however, the electronic hybrid circuit is an economical, accurate and convenient replacement for conventional hybrid circuits, it affords a better match with impedances expected on the tip and ring leads so that echo, if any, is minimized and, because of the current source 10, offers common mode rejection to longitudinal noise on the tip and ring leads.

In FIG. 5 the various novel embodiments of the invention illustrated and described in connection with FIGS. 1-4 have been combined to form a specific product application. In particular, FIG. 5 illustrates what is customarily referred to as a 24V4 terminating set, which provides toll-grade interfacing between two and four-wire voice frequency transmission facilities. The terminating set presents a fixed input impedance to the two-wire side of the facility, and either the same or a different fixed impedance at each of the transmit and receive input ports on the four-wire side of the facility.

The terminating set has receive and transmit channel input ports for interfacing with the receive and transmit channels of a long distance transmission facility, and connects with the tip and ring leads T and R of a two-wire local transmission facility. In operation, a voice signal from a distant subscriber at the receive port is converted to a signal across the tip and ring leads for being received by a local subscriber, and voice signals from the local subscriber across the tip and ring leads are coupled with the transmit port for being sent to the distant subscriber, whereby two-way communication may occur. To this end, it is intended that an op amp A9 coupled with the receive port translate the signal thereat into a voltage, and that a representation of the voltage appear across the load impedance $Z_m$, which is the impedance of the local subscriber's hand set. It is also intended that any voltage $V_{tr}$ across the tip and ring leads generated in response to a signal at the receive port be blocked from returning to the transmit port, so that echo is not heard by the distant subscriber. However, voltages generates across the tip and ring leads by the source $V_m$, and which represent voice signals of the local subscriber, are to be coupled with the transmit port, after being scaled by the op amp A6, for being sent to the distant subscriber.

More particularly, all of the functions performed by the embodiments of the invention shown in FIGS. 1-4 have been combined into the terminating set. The receive channel port of the set is defined at a transformer T1, the secondary winding of which has a resistor R35 connected thereacross and to a noninverting input to the op amp A9. A pair of resistors R36 and R37 control the gain of the op amp, so that the op amp imparts gain or loss to the signal from the receive channel. The op amp A9 takes the place of the signal source V1 of FIGS. 1 and 4, and its output is applied to the resistor R2 at the noninverting input to the current source 10. The outputs from the current source are coupled with the tip and ring leads and provide common mode rejection to longitudinal noise thereon.

To perform an impedance cancelling function, an impedance canceller 20 of the type illustrated and described in FIG. 2 is connected at its inputs across the tip and ring leads and to the junctures between the inductor L1 and the resistors R14 and R15, which represent an unwanted impedance. The output from the impedance canceller is applied through the resistor 16 to the inverting input to the op amp A2 of the current source 10 so that, and as described with respect to FIG. 2, in response to a metallic voltage on the tip and ring leads the current source generates on the leads the same current that would otherwise flow through the unwanted impedance in response to the metallic voltage, whereby the impedance appears as an open circuit to the metallic voltage.

To generate a selected input impedance $Z_{in}$ across the tip and ring leads, a voltage detecting circuit 30 has its inputs across the tip and ring leads and its output coupled through the impedance Z27 with the inverting input to the op amp A1 of the current source 10. As described with respect to FIG. 3, connecting the impedance Z27 in this manner causes the current source to generate a positive input impedance $Z_{in}$, the value of which is determined by the value of the impedance Z27. In this connection, the current source then generates on the tip and ring leads, in response to a metallic voltage, an inverted output current of the same value that would flow through an impedance $Z_{in}$, connected across the tip and ring leads, in response to the metallic voltage.

The electronic hybrid portion 40 of the terminating set, which enables the same to couple a four-wire voice frequency transmission facility with the tip and ring leads of a two-wire facility, comprises the op amps A7 and A8, their associated resistors R30-R34, and the impedances $Z_m'$ and $Z_{in}'$. The inverting input to the op amp A7 is coupled through the resistor R30 to the juncture between the op amp A9 and the resistor R2, and the output from the op amp A8 is applied through the resistor R34 to the inverting input to the op amp A6. In its operation, and as explained with respect to FIG. 4, the electronic hybrid controls the signal applied to the inverting input to the op amp A6 so that voltage signals across the tip and ring leads generated in response to signals on the receive channel do not cause an output from the op amp, but so that signals across the leads in response to the source $V_m$ do. The output from the op amp A6 is coupled through a resistor R38 to a primary winding of a transformer T2, the secondary winding of which forms the transmit port of the terminating set.

It should be noted that the electronic hybrid circuit 40 as shown in FIG. 5 differs that in FIG. 4 in the inclusion of the impedance $Z_{in}'$. However, in view of the impedance $Z_{in}$ being generated by the current source in parallel with the load impedance $Z_m$, the impedance $Z'_{in}$ must be included in parallel with the impedance $Z'_m$ to properly balance the electronic hybrid circuit to prevent introduction of echo on the transmit channel.

While embodiments of the invention have been described in detail, various modifications and other embodiments thereof may be devised by one skilled in the art without departing from the spirit and the scope of the invention, as defined in the appended claims.

What is claimed is:

1. An impedance generator for interfacing with a two-wire transmission system, for example with the tip and ring leads of a telephone pair, for generating a controlled current flow through the system which generates a selected impedance across the wires and for providing common mode rejection to longitudinal voltages on the system, said impedance generator having first and second outputs each for connection with a separate one of the wires and comprising first and second voltage amplifier means each having an input, an output and an output impedance connected between the amplifier means output and a separate one of said impedance generator outputs, said first voltage amplifier means output being connected through its output impedance with said impedance generator first output; means for connecting said first amplifier means output with said second amplifier means input so that voltage signals at said first amplifier means input control the voltages generated at each of said amplifier means outputs; feedback means coupled between said impedance generator first output and said first amplifier means input; and circuit means coupled between said impedance generator outputs and said first amplifier means input, said feedback means and said circuit means coupling signals at said impedance generator outputs from the wires of the transmission system to said first amplifier means input, said feedback means and said circuit means in response to equal longitudinal voltages on the wires coupling to said first voltage amplifier means input signals which cancel to zero at said first voltage amplifier means input so that said first and second voltage amplifier means do not generate voltages at their outputs in response to equal longitudinal voltages on the wires, whereby said impedance generator has common mode rejection to equal longitudinal voltages on the wires, wherein said first and second amplifier means each generate zero volts or reference potential at their outputs in response to equal longitudinal voltages on the wires and substantially equal value and opposite direction current flows through their output impedances, and therefore at said impedance generator outputs, in response to and having a value in accordance with non-cancelling signals at said first amplifier means input, and wherein the two-wire transmission system is of the type having a metallic voltage across the wires, said impedance generator including means connected with the outputs from said impedance generator for sensing the metallic voltage thereacross and therefore across the wires and for generating at an output therefrom a control voltage having a value in accordance therewith; and means for coupling said sensing means output with said first voltage amplifier means input for controlling operation of said first and second amplifier means to generate at said impedance generator outputs a current flow equal to that which would flow through the selected impedance if the metallic voltage were impressed across the impedance, whereby said impedance generator exhibits the selected impedance at its outputs and across the wires.

2. An impedance generator as in claim 1, said means for sensing comprising differential amplifier means.

3. An impedance generator as in claim 1, wherein said impedance generator exhibits a selected positive impedance at its outputs and across the wires.

4. An impedance generator as in claim 1, wherein said impedance generator exhibits a selected negative impedance at its outputs and across the wires.

5. An impedance generator as in claim 1, wherein said impedance generator exhibits at its outputs and across the wires a selected impedance having both positive and negative components.

6. An impedance generator for interfacing with a two-wire transmission system of a type having a metallic impedance and voltage source connected in series across the wires, said impedance generator having first and second outputs each for connection with a separate one of the wires for generating through the wires and the metallic impedance a controlled current flow to generate a selected positive impedance across the wires and for exhibiting common mode rejection to longitudinal voltages on the wires, said impedance generator comprising a first operational amplifier (op amp) A1 connected at a noninverting input thereto with reference or ground potential; a resistor R1 connected at one end to an output from said op amp A1 and coupled at an opposite end with said impedance generator first output; a second op amp A2 connected at a noninverting input thereto with reference potential; a resistor R3 connected between the inverting input to and an output from said op amp A2; a resistor R4 connected between the output from said op amp A2 and an inverting input to said op amp A1; a resistor R5 connected between the inverting input to and the output from said op amp A1; a resistor R6 connected between said opposite end of said resistor R1 and the inverting input to said op amp A2; an op amp A3 connected at a noninverting input thereto with reference or ground potential; a resistor R8 connected between the output from said op amp A1 and an inverting input to said op amp A3; a resistor R9 connected between the inverting input to and an output from said op amp A3; a resistor R10 connected at one end with the output from said op amp A3 and coupled at an opposite end with said impedance generator second output; a resistor R11; a resistor R12 connected in series with said resistor R11 between said opposite ends of said resistors R1 and R10 and at a juncture therebetween with the inverting input to said op amp A1; and a resistor R13 connected between said opposite end of said resistor R10 and ground, said impedance generator further including differential amplifier means having inputs connected with said impedance generator outputs for sensing the metallic voltage across the wires, said differential amplifier means having a gain K and generating at an output therefrom a voltage having a value equal to said gain multiplied by the metallic voltage across the wires; and an impedance Z27 connected between said differential amplifier means output and the inverting input to said op amp A1, whereby in response to a metallic voltage across the wires said differential amplifier means output voltage operates said op amp A1 to generate an inverted current at said impedance generator outputs of a value equal to that which would flow through a selected positive input impedance $Z_{in}$ connected across said impedance generator outputs in response to the metallic voltage, wherein the value of said resistors R1, R3-R6 and R8-R13 are selected such that the positive input impedance $Z_{in}$ has a value equal to:

$$Z_{in} = R1Z27/KR6,$$

wherein said impedance generator exhibits the selected positive input impedance $Z_{in}$ at its outputs and across the wires.

7. An impedance generator as in claim 6, wherein said resistors R1, R3-R6 and R8-R13 are selected to have values such that:

$$R1 = R10,$$

$$R3 = R4 = R5,$$

$$R6 = R13,$$

$$R8 = R9,$$

$$R11 = R12 = 2R6 = 2R13, \text{ and}$$

$$R5 = R6 + R1.$$

8. An impedance generator for interfacing with a two-wire transmission system of a type having a metallic impedance and voltage source connected in series across the wires, said impedance generator having first and second outputs each for connection with a separate one of the wires for generating through the wires and the metallic impedance a controlled current flow to generate a selected negative impedance across the wires and for exhibiting common mode rejection to longitudinal voltages on the wires, said impedance generator comprising a first operational amplifier (op amp) A1 connected at a noninverting input thereto with reference or ground potential; a resistor R1 connected at one end to an output from said op amp A1 and coupled at an opposite end with said impedance generator first output; a second op amp A2 connected at a noninverting input thereto with reference potential; a resistor R3 connected between the inverting input to and an output from said op amp A2; a resistor R4 connected between the output from said op amp A2 and an inverting input to said op amp A1; a resistor R5 connected between the inverting input to and the output from said op amp A1; a resistor R6 connected between said opposite end of said resistor R1 and the inverting input to said op amp A2; an op amp A3 connected at a noninverting input thereto with reference or ground potential; a resistor R8 connected between the output from said op amp A1 and an inverting input to said op amp A3; a resistor R9 connected between the inverting input to and an output from said op amp A3; a resistor R10 connected at one end with the output from said op amp A3 and coupled at an opposite end with said impedance generator second output; a resistor R11; a resistor R12 connected in series with said resistor R11 between said opposite ends of said resistors R1 and R10 and at a juncture therebetween with the inverting input to said op amp A1; and a resistor R13 connected between said opposite end of said resistor R10 and ground, said impedance generator further including differential amplifier means having inputs connected with said impedance generator outputs for sensing the metallic voltage across the wires, said differential amplifier means having a gain K and generating at an output therefrom a voltage having a value equal to said gain multiplied by the metallic voltage across the wires; and an impedance Z27' connected between said differential amplifier means output and the inverting input to said op amp A2, whereby in response to a metallic voltage across the wires said differential amplifier means output voltage operates said op amp A1 to generate a noninverted current at said impedance generator outputs of a value equal to that which would flow through a selected negative input impedance $Z_{in}$ connected across said impedance generator outputs in response to the metallic voltage, wherein the values of the resistors R1, R3-R6 and R8-R13 are selected such that the negative input impedance $Z_{in}$ has a value equal to:

$$Z_{in} = R1Z27'/KR6,$$

whereby said impedance generator exhibits the selected negative input impedance at its outputs and across the wires.

9. An impedance generator as in claim 8, wherein said resistors R1, R3-R6 and R8-R13 are selected to have values such that:

$$R1 = R10,$$

$$R3 = R4 = R5,$$

$$R6 = R13,$$

$$R8 = R9,$$

$$R11 = R12 = 2R6 = 2R13, \text{ and}$$

$$R5 = R6 + R1.$$

10. An impedance generator for a two-wire transmission system of the type having a metallic voltage across the wires, comprising a current source having an input and first and second outputs, each output being connectable with a separate one of the wires, said current source generating at its outputs and through the wires a current flow having a value in accordance with the value of a signal at its input, said current source including feedback means coupled between said first output and said input and circuit means coupled between said first and second outputs and said input, said feedback means and said circuit means coupling signals at said impedance generator first and second outputs from the wires of the transmission system to said current source input, said feedback means and said circuit means in response to equal longitudinal voltages on the wires coupling to said input signals which cancel to zero at said first input so that said current source does not generate a current flow at said first and second outputs in response to equal longitudinal voltages on the wires, whereby said current source has common mode rejection to equal longitudinal voltages on the wires, said current source generating substantially equal value and opposite direction current flows at said first and second outputs in response to and having a value in accordance with noncancelling signals at said input; sensing circuit means connected at inputs thereto with said current source first and second outputs for sensing the metallic voltage thereacross and therefore across the wires and for generating at an output therefrom a control signal having a value in accordance therewith; and means for coupling said sensing circuit means output with said current source input for applying said control signal thereto to operate said current source so that the same generates at its outputs a current flow representative of that which would occur through a selected impedance connected across said current source first and second outputs, and therefore across the wires, in response to the metallic voltage, whereby said impedance generator exhibits the selected impedance across said current source outputs and therefore across the wires.

11. An impedance generator as in claim 10, wherein said current flow at said current source outputs exhibits a selected positive impedance across said outputs.

12. An impedance generator as in claim 10, wherein said current flow at said current source outputs exhibits a selected negative impedance across said outputs.

13. An impedance generator as in claim 10, wherein said sensing circuit means comprises differential amplifier means coupled at first and second outputs, respectively, for detecting the metallic voltage on the wires, said differential amplifier means generating said control signal at an output therefrom.

14. An impedance generator as in claim 13, wherein said differential amplifier comprises an operational amplifier (op amp), and circuit means connecting one input to said op amp with said current source first output and another input to said op amp with said current source second output.

15. An impedance generator for a two-wire transmission system of the type having a metallic voltage across the wires, comprising a current source having an input and first and second outputs, each output being connectable with a separate one of the wires, said current source generating at its outputs and through the wires a current flow having a value in accordance with the value of a signal at its input; sensing circuit means connected at inputs thereto with said current source outputs for sensing the metallic voltage thereacross and therefore across the wires and for generating at an output therefrom a control signal having a value in accordance therewith; and means for coupling said sensing circuit means output with said current source input for applying said control signal thereto to operate said current source so that the same generates at its outputs a current flow representative of that which would occur through a selected impedance connected across said current source first and second outputs and therefore across the wires in response to the metallic voltage, whereby said impedance generator exhibits the selected impedance across said current source outputs and therefore across the wires, wherein said sensing circuit means comprises differential amplifier means coupled at first and second inputs thereto with said current source first and second outputs, respectively, for detecting the metallic voltage on the wires, said differential amplifier means generating said control signal at an output therefrom and including an operational amplifier (op amp) and circuit means connecting one input to said op amp with said current source first output and connecting another input to said op amp with said current source second output, and wherein said circuit means comprises a first resistor connected in series with a first capacitor between a noninverting input to said op amp and said current source first output; a second resistor connected in series with a second capacitor between an inverting input to said op amp and said current source second output; a third resistor connected between the inverting input to and the output from said op amp; and a fourth resistor connected between the noninverting input to said op amp and reference potential or ground.

16. An impedance generator as in claim 15, wherein said first and second capacitors have equal values, said first and second resistors have equal values, said third and fourth resistors have equal values, and said first and second resistors have a significantly higher impedance than said first and second capacitors at the frequency of the metallic voltage, whereby said op amp has common mode rejection to longitudinal voltages on the wires and at said current source outputs.

* * * * *